United States Patent
Kock et al.

(10) Patent No.: US 7,106,654 B2
(45) Date of Patent: Sep. 12, 2006

(54) ARRANGEMENT COMPRISING A MEMORY DEVICE AND A PROGRAM-CONTROLLED UNIT

(75) Inventors: Ernst Josef Kock, Kirchseeon (DE); Frank Hellweig, München (DE)

(73) Assignee: Infineon Technologies AG, Munich (DE)

( * ) Notice: Subject to any disclaimer, the term of this patent is extended or adjusted under 35 U.S.C. 154(b) by 70 days.

(21) Appl. No.: 11/018,327

(22) Filed: Dec. 21, 2004

(65) Prior Publication Data

US 2005/0157586 A1 Jul. 21, 2005

(30) Foreign Application Priority Data

Dec. 23, 2003 (DE) .................... 103 61 496

(51) Int. Cl.
*G11C 8/00* (2006.01)
(52) U.S. Cl. .................... 365/233; 713/500; 326/93
(58) Field of Classification Search ................ 365/233; 713/500, 502; 326/93
See application file for complete search history.

(56) References Cited

U.S. PATENT DOCUMENTS

| | | | |
|---|---|---|---|
| 5,805,873 A | 9/1998 | Roy | 395/557 |
| 6,198,688 B1 * | 3/2001 | Choi | 365/233 |
| 6,760,857 B1 * | 7/2004 | Lau et al. | 713/500 |
| 6,778,465 B1 * | 8/2004 | Shin | 365/233 |
| 6,791,889 B1 * | 9/2004 | Peterson | 365/193 |

* cited by examiner

*Primary Examiner*—Son T. Dinh
*Assistant Examiner*—Eric J. Wendler
(74) *Attorney, Agent, or Firm*—Baker Botts L.L.P.

(57) ABSTRACT

An arrangement comprises a memory device for storing data, and a program-controlled unit with a memory interface for reading data out of the memory device. The memory device is supplied with a first clock signal and transmits the data at the rate of a second clock signal, and the second clock signal to the memory interface when the memory interface performs a read access. The first clock signal is also supplied to the memory interface which generates from this signal a third clock signal which has the same frequency as the first and second clock signal but a predetermined phase shift with respect to the second clock signal. The memory interface accepts the data with the rising and/or falling edges of the third clock signal or the inverted third clock signal, and the third clock signal is also used as clock signal by other components of the memory interface.

20 Claims, 2 Drawing Sheets

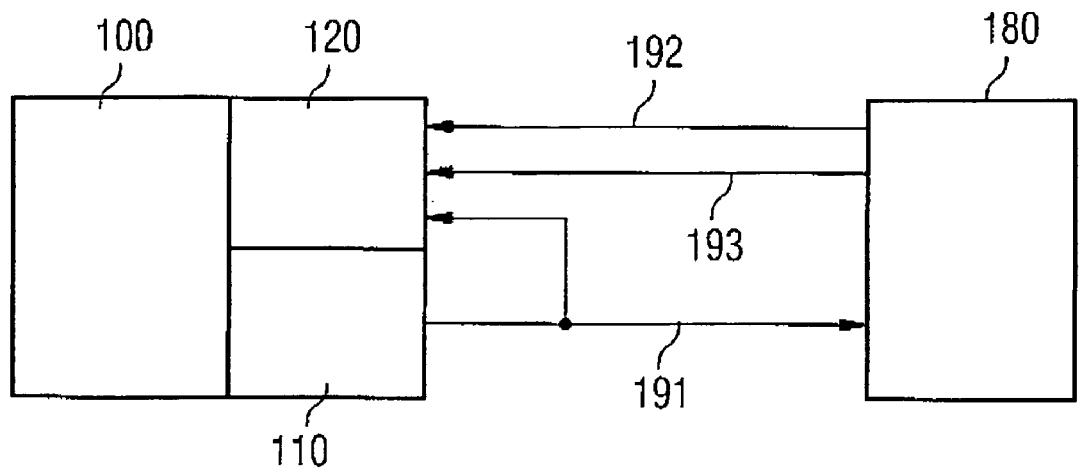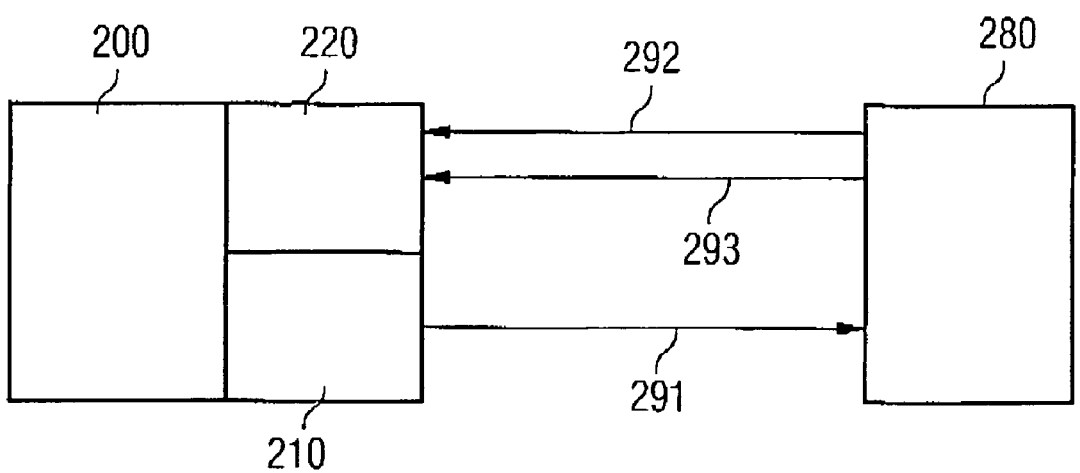

ARRANGEMENT COMPRISING A MEMORY DEVICE AND A PROGRAM-CONTROLLED UNIT

PRIORITY

This application claims priority to German Patent Application No. 103 61 496.6 filed on Dec. 23, 2003.

1. Technical Field of the Invention

The present invention relates to an arrangement comprising a memory device for storing data, and a program-controlled unit with a memory interface for reading data out of the memory device, the memory device being supplied with a first clock signal, and the memory device transmitting the data requested from the memory device at the rate of a second clock signal based on the first clock signal, and the second clock signal to the memory interface when the memory interface performs a read access of the memory device.

2. Description of Related Art and Background of the Invention

Such an arrangement is illustrated in FIG. 3. In this arrangement, the memory device is formed by a DDR SDRAM and is designated by the reference symbol 280, and the program-controlled unit is formed by a microcontroller and is designated by the reference symbol 200.

The microcontroller 200 contains a clock signal generating device 210, a memory interface 220 and a multiplicity of other components such as, for example, a CPU, internal memory devices, a DMA controller, an analog/digital converter etc., which, however, are not shown in FIG. 3 and are also not described in greater detail here.

As already indicated by the designation, the clock signal generating device 210 generates a (first) clock signal.

The memory interface 220 is used for performing read and write accesses of the memory device 280, but at present only the read accesses are of interest and of these only the receiving and further processing or forwarding of the data which are transmitted during a read access of the memory device 280 from the memory device to the microcontroller 200.

The microcontroller 200 and the memory device 280 are connected to one another via a multiplicity of address, data and control lines of which, however, only a first clock signal line 291, a second clock signal line 292 and a data bus 293 are shown in FIG. 3.

The first clock signal generated by the clock signal generating device 210 is transmitted to the memory device 280 via the first clock signal line 291. Data requested by the memory interface 220 by a read access of the memory device 280 are transmitted via the data bus 293 from the memory device 280 to the memory interface 220. The memory device 280 transmits a so-called DQS signal to the memory interface 220 via the second clock signal line 292.

The DQS signal is a clock signal which is transmitted only during the transmission of data to the microcontroller 200 and signals to the microcontroller the times at which the memory device 280 is outputting new data to the data bus 293. During this process, new data are output to the data bus with each rising edge and with each falling edge of the DQS signal. The microcontroller 200 uses the DQS signal for establishing the times at which it accepts or samples the data supplied to it via the data bus 293 in temporary storage devices provided for this purpose.

The DQS signal is a clock signal running synchronously to the first clock signal. It has the same frequency but is phase-shifted with respect to the first clock signal due to the transit time of the first clock signal from the clock signal generating device 210 to the memory device 280 and will, therefore, be called the second clock signal in the text which follows.

For the sake of completeness, it shall be noted that, instead of the one second clock signal line 292, several second clock signal lines 292 can also be provided via which a number of DQS signals are transmitted. This is done because the lines of the data bus 293 can have different runs and different lengths and because the data transmitted via the data bus 293 can have signal transit times of different lengths for this reason and, therefore, must be sampled at different times by the microcontroller 200. Providing a number of second clock signal lines 292 makes it possible for lines of the data bus 293 which have different runs and/or lengths to be allocated in each case their own second clock signal line 292 running in parallel with the respective data bus lines so that all data can be sampled at the optimum time independently of their transit time.

The arrangement shown in FIG. 3 and described above makes it possible to transmit very large quantities of data per unit time.

However, this requires a microcontroller 200 of complicated structure. In particular, neither the first clock signal generated by the clock signal generating device 220 nor the second clock signal transmitted from the memory device 280 to the memory interface 220 can also be used as clock signal for the components of the memory interface 220 which monitor the transmission of data from the memory device 280 to the microcontroller 200 and/or control the forwarding of the data received from the memory device 280 and initially temporarily stored in temporary storage devices. At least, it would require considerable effort to use the first clock signal or the second clock signal for this purpose.

The second clock signal cannot be used for this purpose because it is only transmitted when the memory device 280 is transmitting data to the memory interface 220.

The first clock signal cannot be used for this purpose or can only be used by accepting disadvantages because it has an undetermined and also time-varying phase shift with respect to the clock with which the data are transmitted to the microcontroller and with which these data are transferred into the temporary storage devices of the memory interface 220. In particular, this phase shift is due to the transit time of the first clock signal transmitted from the clock signal generating device 210 via the first clock signal line 291 to the memory device 280 and the transit time of the signals and data transmitted from the memory device 280 via the second clock signal line 292 and the data bus 293 to the memory interface 220, and the dependence of these transit times on the system configuration and time-varying parameters such as, in particular, the temperature. The phase shifts caused by the said influences or others and, in particular, the time variation of these phase shifts would result in a non-deterministic behavior of the memory interface.

SUMMARY OF THE INVENTION

The present invention is, therefore, based on the object of developing the arrangement according to the prior art in such a manner that it has a memory interface of simple structure and behaving in a deterministic manner.

According to the invention, this object can be achieved by an arrangement comprising a memory device for storing data, and a program-controlled unit with a memory interface for reading data out of the memory device, the memory device being supplied with a first clock signal, and the memory device transmitting the data requested from the memory device at the rate of a second clock signal based on the first clock signal, and the second clock signal, to the memory interface when the memory interface performs a read access of the memory device, wherein the first clock signal is also supplied to the memory interface, the memory interface generates from the first clock signal supplied to it a third clock signal which has the same frequency as the first and the second clock signal but has a predetermined phase shift with respect to the second clock signal, the memory interface accepts the data supplied to it from the memory device with the rising and/or falling edges of the third clock signal or the inverted third clock signal, and the third clock signal is also used as clock signal by other components of the memory interface.

The memory interface of such an arrangement can be of simple structure and still exhibit a deterministic behavior under all circumstances. In particular, varying transit times of the first and of the second clock signal do not have a negative influence on the operation and the behavior of the memory interface.

The first clock signal can be generated by a clock signal generating device contained within the program-controlled unit. The first clock signal can also be generated by a clock signal generating device provided externally to the program-controlled unit. The first clock signal can be supplied to the memory interface via a line extending externally to the program-controlled unit. The third clock signal can be phase-shifted with respect to the second clock signal to such an extent that the rising and/or falling edges of the third clock signal occur at times at which the data transmitted from the memory device to the memory interface are stable and valid. The phase shift can be generated by a delayed locked loop contained in the memory interface and the phase shift of the first clock signal can be corrected in dependence on the time variations of the first clock signal and of the second clock signal in such a manner that the third clock signal is always phase-shifted with respect to the second clock signal by a constant fraction of a period of the latter. The data supplied to the memory interface from the memory device can be supplied to temporary storage devices provided in the memory interface. The temporary storage devices may have a clock signal terminal, the clock signal terminal being supplied with the third clock signal or the inverted third clock signal and the data supplied to the temporary storage devices being transferred into the temporary storage devices with the rising and/or falling edges of the third clock signal or of the inverted third clock signal. The temporary storage devices may have an enable terminal, the enable terminal being supplied with an enable signal and the data supplied to the temporary storage devices being transferred with the rising and/or falling edges of the third clock signal or of the inverted third clock signal only when the enable signal has a particular level. The enable signals can be switched with the rising and/or falling edges of the second clock signal. The third clock signal can also be used as clock signal for a control device of the memory interface which generates the enable signals. The third clock signal can also be used as clock signal for a control device of the memory interface which generates a ready signal which signals that data to be forwarded to another component of the program-controlled unit are present in the temporary storage device. The ready signal can already be generated before the data, the forwarding of which is to be initiated by the ready signal, have been transferred into the temporary storage devices. The third clock signal can also be used as clock signal for a control device of the memory interface which generates an error signal which signals that an error has occurred during the transmission of data from the memory device to the memory interface. The memory device can be formed by a DDR SDRAM. The second clock signal can be a DQS signal.

BRIEF DESCRIPTION OF THE DRAWINGS

In the text which follows, the invention will be explained in greater detail with reference to an exemplary embodiment, referring to the figures, in which:

FIG. 1 shows the basic configuration of the arrangement described in greater detail in the text which follows, FIG. 3 shows the configuration of a conventional arrangement with a memory device and a program-controlled unit.

DETAILED DESCRIPTION OF EMBODIMENTS

Figure 2:
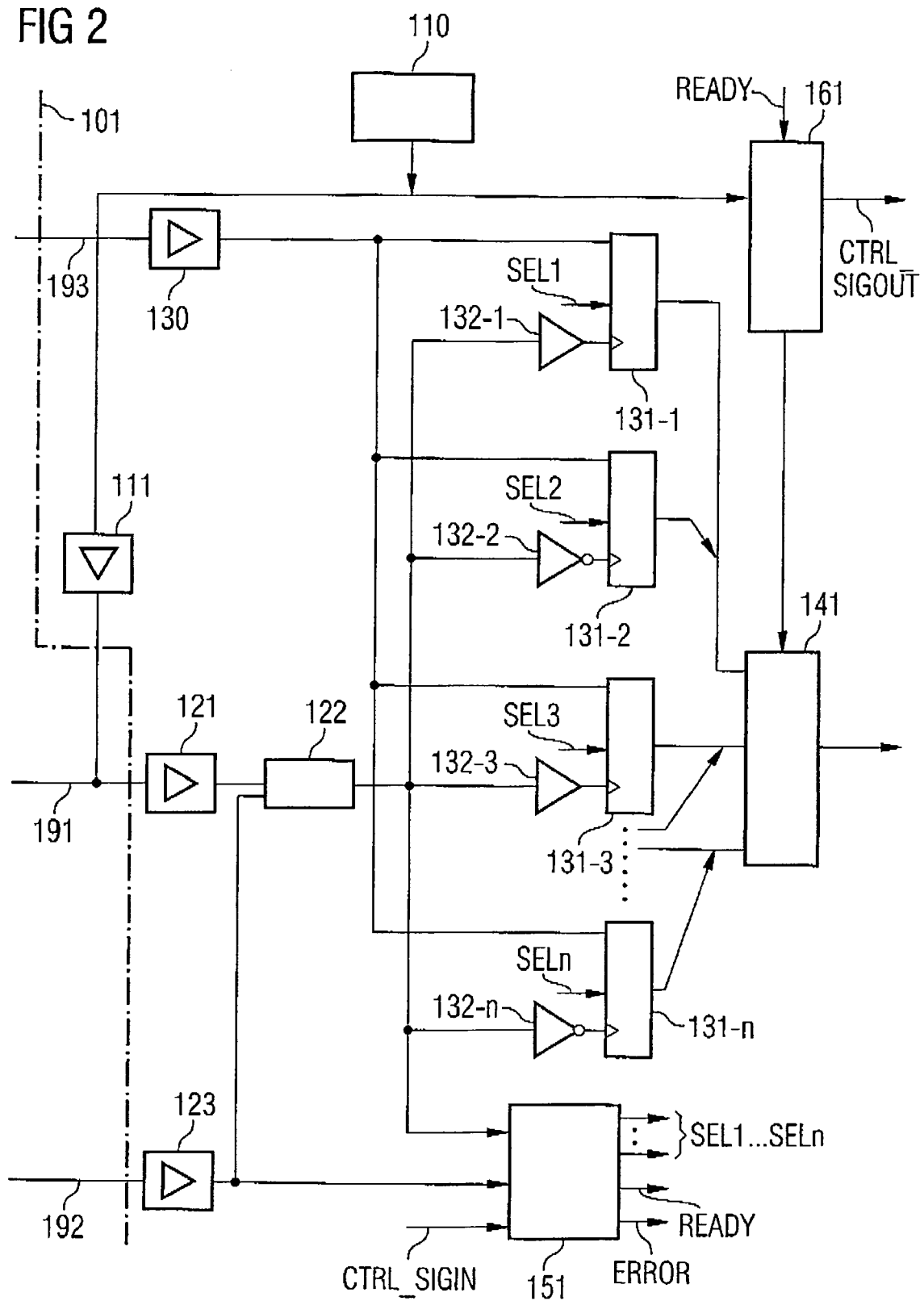
FIG. 2 shows the configuration of a memory interface of a program-controlled unit contained in the arrangement according to FIG. 1.

In the arrangement described in the text which follows, the program-controlled unit is formed by a microcontroller, and the memory device is formed by a DDR SDRAM.

The program-controlled unit could also be formed by another device which executes software programs, for example by a microprocessor or by a signal processor.

In addition, there are also no restrictions with respect to the fact that the memory device is formed by a DDR SDRAM (double data rate SDRAM). The memory device could also be formed by any other memory device which behaves like a DDR SDRAM or similarly, for example, by SDR SDRAM (single data rate SDRAM).

The basic configuration of the arrangement presented here is shown in FIG. 1. The arrangement shown in FIG. 1 consists of a microcontroller 100, a memory device 180 and connecting lines and buses connecting these devices to one another.

The memory device 180 corresponds to the memory device 280 of the arrangement shown in FIG. 3. It is configured like the memory device 280 and also operates like it.

The microcontroller 100 contains a clock signal generating device 110, a memory interface 120 and a multiplicity of other components such as, for example, a CPU, internal memory devices, a DMA controller, an analog/digital converter etc., which, however, are not shown in FIG. 1 and will also not be described in greater detail.

The clock signal generating device 110 corresponds to the clock signal generating device 210 of the arrangement shown in FIG. 3 and, like the clock signal generating device 210, generates a first clock signal. It should be pointed out even at this point that the clock signal generating device generating the first clock signal does not have to be part of the microcontroller; the first clock signal could also be generated by a clock signal generating device provided externally to the microcontroller.

The memory interface 120 is used for performing read and write accesses of the memory device 180, but at present only the read accesses are of interest and of these only the receiving and further processing or forwarding of the data which are transmitted during a read access of the memory device 180 from the memory device to the microcontroller 100.

The read accesses performed by the memory interface 120 are not performed on the own initiative of the memory interface. The memory interface 120, by a read access of the memory device 180, only procures the data which have been requested by another microcontroller component, for example by the CPU of the microcontroller.

If, for example, the CPU needs data stored in the memory device 180, it first requests control via a bus connecting the CPU to the memory interface 120, then transmits a read request specifying the required data via the bus to the memory interface 120 and then waits until the data requested by the read request are supplied to it. Following reception of the read request, the memory interface 120 performs a read access of the memory device 180 and forwards the data then output by the memory device via the bus, which is still controlled by the CPU, to the CPU. A corresponding procedure is performed if it is not the CPU but another microcontroller component which needs data from the memory device 180.

The microcontroller 100 and the memory device 180 are connected to one another via a multiplicity of address, data and control lines of which, however, only a first clock signal line 191, a second clock signal line 192 and a data bus 193 are shown in FIG. 1.

The first clock signal generated by the clock signal generating device 110 is transmitted to the memory device 180 via the first clock signal line 191. The first clock signal line 191 and the signals transmitted via it thus correspond to the first clock signal line 291 of the arrangement shown in FIG. 3 and to the signals transmitted via this line. However, the first clock signal line 191 of the arrangement shown in FIG. 1 is additionally also connected to the memory interface 120 so that the first clock signal transmitted via the first clock signal line 191 is additionally also supplied to the memory interface 120.

Data requested by the memory interface 120 by a read access of the memory device 180 are transmitted from the memory device 180 to the memory interface 120 via the data bus 193. In the example considered, the data bus 193 comprises 32 lines so that 32-bit words can be transmitted via the data bus. It should be clear and does not need a more detailed explanation that the data bus can also comprise more or fewer than 32 lines.

A so-called DQS signal is transmitted via the second clock signal line 192 from the memory device 180 to the memory interface 120. This is precisely the signal which is also transmitted via line 292 of the arrangement shown in FIG. 3. To avoid repetitions, reference is made to the corresponding statements relating to FIG. 3 with respect to other details in this respect. In the text which follows, the DQS signal is sometimes also called the second clock signal.

Differently from the arrangement shown in FIG. 3, however, the DQS signal is not directly used for establishing the times at which the memory interface 120 accepts or samples the data supplied to it via the data bus 193. The sampling times are established by a third clock signal which is generated by the memory interface 120 from the first clock signal supplied to it. The third clock signal is formed by phase shifting the first clock signal in such a manner that the third clock signal is phase-shifted with respect to the DQS signal to such an extent that the rising and/or falling edges of the third clock signal occur at times at which the data transmitted from the memory device 180 to the memory interface 120 are stable and valid. Thus, the third clock signal can be phase-shifted, for example, by a quarter clock period of the DQS signal with respect to the latter. The sampling of the data supplied to the memory interface 120 via the bus 193 in each case occurs at the rising and/or falling edges of the third clock signal. The DQS signal which has hitherto been used for establishing the sampling times will now only be used in the arrangement presented here for generating enable signals described in greater detail later, which determine whether and possibly where data obtained via the data bus 193 are to be temporarily stored in the memory interface. This will be explained in greater detail in the text which follows by referring to FIG. 2.

FIG. 2 shows the configuration of a part of the microcontroller shown in FIG. 1 containing the clock signal generating device and the memory interface.

As in FIG. 1, the clock signal generating device is designated by the reference symbol 110. The clock signal generating device 110 generates the first clock signal already mentioned above and outputs it from the microcontroller 100 via an output pad 111, more precisely to line 191. The boundary between the circuit components provided within the microcontroller 100 and the circuit components provided externally to the microcontroller 100 is identified by a dashed line designated with the reference symbol 101 in FIG. 2. The first clock signal output to the line 191 is transmitted via this line to the memory device 180, not shown in FIG. 2, and to the memory interface 120. The section of line 191 via which the first clock signal is transmitted to the memory interface 120 extends externally to the microcontroller 100 to an input terminal of the microcontroller as a result of which the first clock signal reaches the memory interface 120 via this input terminal and a subsequent input pad 121. The first clock signal is forwarded from the input pad 121 to a delay device, formed by a programmable DLL (delay locked loop) 122 which generates from the first clock signal a third clock signal phase-shifted with respect to the former. The phase shift performed by the DLL is of such a magnitude that the rising and/or falling edges of the third clock signal occur at times at which the data supplied to the memory interface 120 from the memory device 180 are stable and valid. I.e., the phase shift effected by the DLL is of such a magnitude, for example, that the third clock signal is shifted by approximately one quarter clock period of the DQS signal with respect to the DQS signal. For the sake of completeness, it should be noted that the phase shift by a quarter clock period should only be considered as exemplary. The phase shift can also be greater or lesser but must be at least slightly greater than 0 and at the maximum should be slightly less than one half clock period of the DQS signal. The DLL 122 ensures that the third clock signal is phase-shifted by a predetermined extent with respect to the DQS signal under all circumstances. This also applies if the phase angle of the DQS signal changes due to temperature fluctuations or other changes in the environmental conditions. In this connection it should be noted that the phases of the first clock signal and of the DQS signal will not drift apart or only by a little in changing environmental conditions since the memory interface 120 is supplied both with the first clock signal and with the DQS signal via lines extending externally to the microcontroller and thus both signals are essentially exposed to the same influences.

The DLL 122 is also supplied with the DQS signal in addition to the first clock signal. The DQS signal passes via the second clock signal line 192 and an input pad 123 of the microcontroller to the DLL 122 and is additionally supplied to a first control device 151 described more accurately later.

The third clock signal generated by the DLL 122 is forwarded to n temporary storage devices 131-1 to 131-n via n amplifier stages 132-1 to 132-n.

The temporary storage devices 131-1 to 131-n are used for temporarily storing the data supplied to the memory interface 120 via the data bus 193 from the memory device 180 and can be formed, for example, by flipflops, registers, latches, a RAM or the like. "n" is the maximum number of data words which, following a single read access to the memory device 180, are transmitted successively from the latter to the memory interface 120. In the example considered, n is equal to 8; but n can also be arbitrarily much larger or smaller.

In each of the temporary storage devices 131-1 to 131-n, a complete data word can be stored which is transmitted via the data bus 193 from the memory device 180 to the memory interface.

The case in the example considered is thus that the memory interface 120 can request up to 8 data words from the memory device 180 by means of a burst access and that the memory device, following such a read access, transmits successively 8 32-bit data words to the memory interface 120 and that the memory interface 120 has such a number of temporary storage devices or a temporary storage device of such size that all 8 data words can be temporarily stored in it.

Each temporary storage device of the temporary storage devices 131-1 to 131-n contains a data terminal, a clock signal terminal, an enable terminal and an output terminal.

The clock signal terminals are supplied with the third clock signal or the inverted third clock signal, the enable terminals are supplied with enable signals SEL1 to SELn, described more accurately later, and the data terminals are supplied with the data transmitted via the bus 193 from the memory device 180 to the memory interface 120.

The data transmitted via the bus 193 to the memory interface 120 pass via input pads 130 of the microcontroller into the memory interface and are forwarded from these input pads to the data terminals of all temporary storage devices 131-1 to 131-n.

It should be noted at this point that between the input pads 130 and the temporary storage devices 131-1 to 131-n, further temporary storage devices could be provided so that the data transmitted via the bus 193 are supplied to the temporary storage devices 131-1 to 131-n via the further temporary storage devices. The further temporary storage devices would only have to be provided in small numbers. For example, it would be sufficient if only two additional temporary storage devices are provided which are alternately written to and read out. This would have the positive effect that the data transmitted via the bus 193 have to drive a lower load.

Each data word which is transmitted to the memory interface via the bus 193 is temporarily stored in a particular single temporary storage device. The temporary storage device which this is in each case will be determined by the enable signals already mentioned above. The enable signals place the temporary storage devices 131-1 to 131-n into a first or into a second state, the first state being a standby state during which data can be transferred into the relevant temporary storage device, and the second state being a disabled state during which no data can be transferred into the relevant temporary storage device. The enable signals are generated in such a manner that only one enable signal at a maximum has a level by means of which the temporary storage devices can be placed into the standby state. All other enable signals have a level by means of which the temporary storage devices are placed into the disabled state. Placing a temporary storage device into the standby state does not have the consequence that data are transferred into the relevant temporary storage device. This is only a prerequisite for data to be transferred into the temporary storage device.

Transferring data into a temporary storage device only takes place if the relevant temporary storage device is placed into the standby state by the enable signal supplied to it and during the standby state a rising edge occurs in the clock signal supplied to the clock signal terminal of the relevant temporary storage device. More precisely, the situation is that a temporary storage device which is in the standby state accepts the data supplied to it with the rising edge of the clock signal supplied to it. As an alternative, the data transfer could also take place with the falling edge of the clock signal.

The clock signal terminals of the temporary storage devices 131-1 to 131 -n are supplied with different clock signals. More precisely, the situation is that the temporary storage devices are supplied with an odd-numbered index, that is to say temporary storage devices 131-1, 131-3, 131-5, ... are supplied with the third clock signal and the remaining temporary storage devices are supplied with the inverted third clock signal. The clock signal which is supplied to the respective temporary storage devices is determined by the amplifier stages 131-1 to 132-n preceding the temporary storage devices. Each temporary storage device is preceded by one of the amplifier stages 132-1 to 132-n, these amplifier stages being partly inverting amplifier stages and partly non-inverting amplifier stages. The temporary storage devices supplied with the third clock signal are preceded by non-inverting amplifier stages and the temporary storage devices which are supplied with the inverted third clock signal are preceded by inverting amplifier stages. The result is that the data words successively supplied to the memory interface are alternately transferred into the temporary storage devices 131-1 to 131-n with the rising edge and the falling edge of the third clock signal.

However, it is only in certain memory devices such as, for example, the DDR SDRAM considered here, that it is necessary to transfer the data words successively supplied to the memory interface alternately with the rising edge and the falling edge of the third clock signal into the temporary storage devices 131-1 to 131-n. In the case of other memory devices such as, for example, SDR SDRAMs, the memory interface 120 would have to be modified in such a way that the data words successively supplied to the memory interface are always only transferred into the temporary storage devices 131-1 to 13 1-n with the rising edge of the third clock signal or always only with the falling edge of the third clock signal.

The third clock signal is not only used for establishing the times of the transfer of data into the temporary storage devices 131-1 to 131-n. In addition, it is also used as clock signal for other components of the memory interface 120. In particular, it is also used as clock signal for the first control device 151 already mentioned above. At this point it should already be pointed out that the memory interface can also contain any other components which use the third clock signal as clock signal, for example a device which subjects the received data to preprocessing before they are forwarded to another microcontroller component.

As has already been mentioned above, the first control device 151 is supplied with the DQS signal. In addition, the first control device 151 is supplied with the third clock signal and one or more signals CTRL_SIGIN via which the first control device is supplied with information about the read access of the memory device 180, in each case just performed, for example the number of data words read out by the read access of the memory device just performed.

In the example considered, the first control device 151 generates the aforementioned enable signals SEL1 to SELn, a ready signal READY and an error signal ERROR.

It should already be pointed out at this point that the first control device 151 can also be supplied at least partially with other or further signals and that the first control device 151 could also generate other or further signals at least partially.

The enable signals SEL1 to SELn are generated in such a manner that in each case one enable signal at a maximum has a level by means of which a temporary storage device is placed into the standby state. More precisely, the case is that during the transmission of a first data word of a number of data words successively transmitted to the microcontroller, the enable signal supplied to a first temporary storage device is set to a level by means of which the relevant temporary storage device is placed into the standby state, and all other enable signals are set to a level by means of which the temporary storage devices, to which they are applied, are placed into the disabled state, during the transmission of a second data word of a number of data words transmitted successively to the microcontroller, the enable signal supplied to a second temporary storage device is set to a level by means of which the relevant temporary storage device is placed into the standby state and all other enable signals are set to a level by means of which the temporary storage devices, to which they are applied, are placed into the disabled state, during the transmission of a third data word of a number of data words successively transmitted to the microcontroller, the enable signal supplied to a third temporary storage device is set to a level by means of which the relevant temporary storage device is placed into the standby state, and all other enable signals are set to a level by means of which the temporary storage devices, to which they are applied, are placed into the disabled state, etc.

The enable signals are in each case switched with the rising and falling edges of the DQS signal.

If and as long as no data are transmitted from the memory device 180 to the microcontroller 100, the first control device 151 ensures that the enable signals have a level by means of which all temporary storage devices are placed into the disabled state.

Which enable signal is to be supplied to which temporary storage device can be determined by the first control device by checking whether a DQS signal is currently received and by counting the rising and falling edges occurring in the DQS signal.

The ready signal READY generated by the first control device 151 signals to a second control device 161 that data to be forwarded to another microcontroller component are stored in the temporary storage devices 131-1 to 131-n.

There are a number of possibilities for generating the ready signal.

A first possibility consists in that the ready signal is only generated after all data words of a number of data words to be transmitted successively to the microcontroller have been transferred into the temporary storage devices 131-1 to 131-n.

A second possibility consists in that the ready signal is generated after each transfer of data into a temporary storage device.

A third possibility consists in that the ready signal is generated whenever a certain number of temporary storage devices is again loaded with the data currently transmitted to the microcontroller.

In all the abovementioned possibilities, it can be provided that the ready signal is already generated at a time at which not all data, the forwarding of which to another microcontroller component is initiated by the ready signal, have yet been transferred into the temporary storage devices. In this case, however, attention would have to be paid to the fact that the case cannot occur that a data word is forwarded from a temporary storage device which has not yet been loaded at all with the data which are currently transmitted to the microcontroller.

It may be found to be advantageous if the user of the microcontroller is able to set at which times or on the occurrence of which events the ready signal is to be generated.

The ready signal READY can be generated quickly and simply by the first control device 151. From the information supplied to the first control device 151 (DQS, third clock signal, CTRL_SIGIN), it can be determined without problems whether and in which temporary storage devices there are data to be forwarded to another microcontroller component.

The aforementioned error signal ERROR signals that an error has occurred during the transmission of data from the memory device 180 to the memory interface 120. In particular, it can be determined, for example, whether the memory device is outputting more data or fewer data (more data words or fewer data words) than have been requested by the read access of the memory device in each case just executed. This, too, can be rapidly and simply determined by the first control device 151. For this purpose, the first control device only needs to determine the number of the data words already received by the memory device 180 and to compare this number with the number of data words which were requested by the read access of the memory device 180 just executed. The number of data words which have been requested by the read access of the memory device 180 just executed can be determined from the signals CTRL_SIGIN supplied to the first control device 151.

The output terminals of the temporary storage devices 131-1 to 131-n are connected to the input terminals of a multiplexer 141. In the example considered, this multiplexer 141 is constructed in such a manner that it simultaneously switches through the data from in each case two temporary storage devices, that is to say outputs 64-bit data words in the example considered. However, there is no restriction to this. It could also be provided that the multiplexer simultaneously switches through the data of even more temporary storage devices or that the multiplexer in each case only switches through the data from a single temporary storage device.

The multiplexer 141 is driven by the aforementioned second control device 161. As already explained above, this second control device 161 is supplied with the ready signal READY generated by the first control device 151. The second control device 161 drives the multiplexer 141 after each reception of a ready signal, in such a manner that the data stored in the temporary storage devices, the forwarding of which is initiated by the ready signal, are simultaneously or successively forwarded to the microcontroller component expecting these data.

In addition, the second control device 161 generates one or more control signals CTRL_SIGOUT, by means of which certain states or events within the memory interface are signaled to other microcontroller components, for example that the memory interface 120 is currently not being used, i.e. is ready for other read and/or write accesses of the memory device 180 or that an error has occurred.

For the sake of completeness, it should be noted that the second control device 161 could also be supplied at least partially with other or further control signals and that the second control device 161 could also generate at least partially other or further control signals.

The second control device 161 uses as clock signal the clock signal with which the microcontroller component is also operating with which the output terminal of the multiplexer is connected. In the example considered, the microcontroller component, to which the output terminal of the multiplexer is connected, operates with the first clock signal generated by the clock generating device 110. For this reason, the second control device is also using the first clock signal as clock signal. However, there is no restriction to this: the microcontroller component to which the output terminal of the multiplexer is connected, and the second control device, can also operate with any other clock signal.

In the example considered, the output terminal of the multiplexer 141 is connected to the system bus of the microcontroller to which the CPU of the microcontroller and various other microcontroller components are also connected. Via this system bus, the data output from the multiplexer are forwarded to the microcontroller component which has caused the memory interface to execute the read access of the memory device 180 just executed.

The arrangement presented here makes it possible, independently of the details of its practical implementation, to transfer and forward or process further rapidly and without errors with little effort the data supplied to a program-controlled unit from an external memory device.

We claim:

1. An arrangement comprising:
   a memory device for storing data, and
   a program-controlled unit with a memory interface for reading data out of the memory device,
   the memory device being supplied with a first clock signal, and
   the memory device transmitting the data requested from the memory device at the rate of a second clock signal based on the first clock signal, and the second clock signal to the memory interface when the memory interface performs a read access of the memory device,
   wherein
   the first clock signal is also supplied to the memory interface,
   the memory interface generates from the first clock signal supplied to it a third clock signal which has the same frequency as the first and the second clock signal but has a predetermined phase shift with respect to the second clock signal,
   the memory interface accepts the data supplied to it from the memory device with the rising and/or falling edges of the third clock signal or the inverted third clock signal, and
   the third clock signal is also used as clock signal by other components of the memory interface.

2. The arrangement as claimed in claim 1, wherein the first clock signal is generated by a clock signal generating device contained within the program-controlled unit.

3. The arrangement as claimed in claim 1, wherein the first clock signal is generated by a clock signal generating device provided externally to the program-controlled unit.

4. The arrangement as claimed in claim 2, wherein the first clock signal is supplied to the memory interface via a line extending externally to the program-controlled unit.

5. The arrangement as claimed in claim 3, wherein the first clock signal is supplied to the memory interface via a line extending externally to the program-controlled unit.

6. The arrangement as claimed in claim 1, wherein the third clock signal is phase-shifted with respect to the second clock signal to such an extent that the rising and/or falling edges of the third clock signal occur at times at which the data transmitted from the memory device to the memory interface are stable and valid.

7. The arrangement as claimed in claim 6, wherein the phase shift is generated by a delayed locked loop contained in the memory interface and the phase shift of the first clock signal is corrected in dependence on the time variations of the first clock signal and of the second clock signal in such a manner that the third clock signal is always phase-shifted with respect to the second clock signal by a constant fraction of a period of the latter.

8. The arrangement as claimed in claim 1, wherein the data supplied to the memory interface from the memory device are supplied to temporary storage devices provided in the memory interface.

9. The arrangement as claimed in claim 8, wherein the temporary storage devices have a clock signal terminal, the clock signal terminal being supplied with the third clock signal or the inverted third clock signal and the data supplied to the temporary storage devices being transferred into the temporary storage devices with the rising and/or falling edges of the third clock signal or of the inverted third clock signal.

10. The arrangement as claimed in claim 9, wherein the temporary storage devices have an enable terminal, the enable terminal being supplied with an enable signal and the data supplied to the temporary storage devices being transferred with the rising and/or falling edges of the third clock signal or of the inverted third clock signal only when the enable signal has a particular level.

11. The arrangement as claimed in claim 9, wherein the enable signals are switched with the rising and/or falling edges of the second clock signal.

12. The arrangement as claimed in claim 1, wherein the third clock signal is also used as clock signal for a control device of the memory interface which generates the enable signals.

13. The arrangement as claimed in claim 1, wherein the third clock signal is also used as clock signal for a control device of the memory interface which generates a ready signal which signals that data to be forwarded to another component of the program-controlled unit are present in the temporary storage device.

14. The arrangement as claimed in claim 13, wherein the ready signal is already generated before the data, the forwarding of which is to be initiated by the ready signal, have been transferred into the temporary storage devices.

15. The arrangement as claimed in claim 1, wherein the third clock signal is also used as clock signal for a control device of the memory interface which generates an error signal which signals that an error has occurred during the transmission of data from the memory device to the memory interface.

16. The arrangement as claimed in claim 1, wherein the memory device is formed by a DDR SDRAM.

17. The arrangement as claimed in claim 16, wherein the second clock signal is a DQS signal.

18. An arrangement comprising:

a memory device for storing data, and a program-controlled unit with a memory interface for reading data out of the memory device, the memory device being supplied with a first clock signal, and the memory device transmitting the data requested from the memory device at the rate of a second clock signal based on the first clock signal, and the second clock signal to the memory interface when the memory interface performs a read access of the memory device, wherein the first clock signal is also supplied to the memory interface, the memory interface generates from the first clock signal supplied to it a third clock signal which has the same frequency as the first and the second clock signal but has a predetermined phase shift with respect to the second clock signal, the memory interface accepts the data supplied to it from the memory device with the rising and/or falling edges of the third clock signal or the inverted third clock signal, the third clock signal is also used as clock signal by other components of the memory interface, and wherein the first clock signal is generated by a clock signal generating device contained within the program-controlled unit.

19. An arrangement comprising:

a memory device for storing data, and a program-controlled unit with a memory interface for reading data out of the memory device, the memory device being supplied with a first clock signal, and the memory device transmitting the data requested from the memory device at the rate of a second clock signal based on the first clock signal, and the second clock signal to the memory interface when the memory interface performs a read access of the memory device, wherein the first clock signal is also supplied to the memory interface, the memory interface generates from the first clock signal supplied to it a third clock signal which has the same frequency as the first and the second clock signal but has a predetermined phase shift with respect to the second clock signal, the memory interface accepts the data supplied to it from the memory device with the rising and/or falling edges of the third clock signal or the inverted third clock signal, the third clock signal is also used as clock signal by other components of the memory interface, and wherein the first clock signal is generated by a clock signal generating device provided externally to the program-controlled unit.

20. The arrangement as claimed in claim 19, wherein the first clock signal is supplied to the memory interface via a line extending externally to the program-controlled unit.

* * * * *